(12) United States Patent
Zhao et al.

(10) Patent No.: US 8,580,377 B2
(45) Date of Patent: Nov. 12, 2013

(54) LAMINATED POLYESTER FILM AND SOLAR PANEL MADE THEREOF

(75) Inventors: Ruofei Zhao, Shanghai (CN); Guangjun Yin, Shanghai (CN); Changming Ye, Shanghai (CN)

(73) Assignee: E I du Pont de Nemours and Company, Wilmington, DE (US)

( * ) Notice: Subject to any disclaimer, the term of this patent is extended or adjusted under 35 U.S.C. 154(b) by 393 days.

(21) Appl. No.: 12/919,111

(22) PCT Filed: Feb. 27, 2009

(86) PCT No.: PCT/US2009/035402
§ 371 (c)(1),
(2), (4) Date: Aug. 24, 2010

(87) PCT Pub. No.: WO2009/108832
PCT Pub. Date: Sep. 3, 2009

(65) Prior Publication Data
US 2010/0326501 A1    Dec. 30, 2010

(30) Foreign Application Priority Data

Feb. 29, 2008    (CN) .......................... 2008 1 0081582

(51) Int. Cl.
*B32B 18/00* (2006.01)
*B32B 27/06* (2006.01)
*B32B 27/20* (2006.01)
*B32B 27/36* (2006.01)
*H01L 31/0203* (2006.01)

(52) U.S. Cl.
USPC ........... 428/336; 428/339; 428/480; 428/702; 428/910; 257/433

(58) Field of Classification Search
None
See application file for complete search history.

(56) References Cited

U.S. PATENT DOCUMENTS

| | | | |
|---|---|---|---|
| 5,508,075 A * | 4/1996 | Roulin et al. | 428/35.7 |
| 6,331,344 B1 * | 12/2001 | Okazaki et al. | 428/141 |
| 2007/0111009 A1 | 5/2007 | Morris et al. | |
| 2008/0113122 A1 | 5/2008 | Moon et al. | |

FOREIGN PATENT DOCUMENTS

| | | | |
|---|---|---|---|
| JP | 11105222 A | * | 4/1999 |
| JP | 2006270025 A | | 10/2006 |
| JP | 2007175885 A | | 7/2007 |
| JP | 2007203464 A | | 8/2007 |
| JP | 2007281056 A | | 10/2007 |

* cited by examiner

Primary Examiner — Ramsey Zacharia

(57) ABSTRACT

This invention discloses a laminated film comprising two thermoplastic polyester outer layers of identical polytrimethylene terephthalates, different polytrimethylene terephthalates, identical blends of polytrimethylene terephthalate or different blends of polytrimethylene terephthalate and a middle layer selected from a metal foil, polyethylene-vinyl acetate, and a thermoplastic polymer comprising thermoplastic polyester different from the thermoplastic polyester of the two outer layers, wherein the middle layer is laminated between the two outer layers. This invention also discloses a solar panel comprising a back sheet made of the laminated film.

17 Claims, 3 Drawing Sheets

LAMINATED POLYESTER FILM AND SOLAR PANEL MADE THEREOF

FIELD OF THE INVENTION

The present invention relates to a laminated polymer film with improved moisture barrier property, flexibility and degree of warpage. It also relates to a solar panel made of such laminated polymer film.

BACKGROUND OF THE INVENTION

With global warming, governments around the world are becoming increasingly demanding on energy conservation and emission reduction. Therefore, finding new energy sources to replace fossil fuels has become an urgent need.

Solar energy is a clean, pollution-free and inexhaustible source of energy. At present, solar energy is utilized primarily via its conversion into electricity by solar panels. The electricity is then used to power electric water heaters, electric vehicles and satellite components.

A solar panel is a photovoltaic device generating electricity directly from light, particularly from sunlight. A solar panel of the prior art mainly comprises a back sheet, a photovoltaic circuit, an encapsulation material and a front sheet.

The encapsulation materials, such as polyethylene-vinyl acetate films, are used in solar panels to bond the front and back sheets together. In a lamination operation carried out at about 150° C., molten polyethylene-vinyl acetate flows into voids in a solar panel to encapsulate the solar cells. A conductive adhesive may also be used to connect solar cells to each other.

The primary role of a front sheet in a solar panel is to protect solar cells against mechanical impact and weathering. In order to make full use of the light, the front sheet must have a high light transmittance in a certain range of the spectrum (for example, for polycrystalline silicon solar cells, the range is 400-1,100 nm). The front sheet of a prior art solar panel is typically made of glass (usually low-iron tempered flint glass with a thickness of 3-4 mm) or polymeric materials.

The primary role of the back sheet in a solar panel is to protect solar cells and encapsulation materials and/or conductive adhesives against moisture and oxidation. During assembly of a solar panel, the back sheet is also used as a mechanical shield to prevent scratches and as an insulator. Therefore, excellent moisture barrier property and flexibility are required for the back sheet.

A back sheet commonly used in solar panels is a multi-layer adhesively laminated film, mainly including the following three types:

1) Laminated TPE film: fluoropolymers (e.g., polyfluoroethylene)/polyethylene terephthalate/ethylene-vinyl acetate copolymer containing 1%-70% vinyl acetate;

2) Laminated TPT film: fluoropolymer (e.g., polyfluoroethylene)/polyethylene terephthalate/fluoropolymer (e.g., polyfluoroethylene);

3) Laminated PET film: polyethylene terephthalate/polyethylene terephthalate/polyethylene terephthalate.

For instance, in order to form a low cost thermoplastic resin film that has excellent hydrolysis resistance and delamination resistance, and improves photoelectric conversion efficiency of solar cells by enhancing shielding capability, JP 2006-270025A disclosed a thermoplastic resin sheet for making back sheets of solar cells. The thermoplastic resin is a polycondensate of dicarboxylic acid derivatives and diol derivatives. The thermoplastic resin sheet provided by JP 2006-270025A includes, for example, polyethylene terephthalate, polytrimethylene terephthalate, polybutylene terephthalate, polyethylene 2,6-naphthalate, poly(1,4-cyclohexylene-dimethylene terephthalate), and polyethylene glycol-co-cyclohexane 1,4-dimethanol terephthalate. In particular, polyethylene terephthalate is widely used due to its low price. With environmental protection awareness becoming deeply rooted in the public mind and environmental regulations becoming more and more stringent, solar panels are being more and more commonly used to replace common coal- or gas-burning devices. Therefore, solar panels are also being more and more commonly used under a variety of harsh environmental conditions. This has resulted in new and higher requirements for solar panel performance, such as moisture resistance. Although conventional solar panel back sheets can provide good moisture barrier properties, there is still room for improvement.

In addition, during assembly of solar cells, component manufacturers often find that the flexibility and degree of warpage of the back sheets have a large impact on production. A back sheet that is too soft is not easily flattened. Wrinkles may occur during lamination. A back sheet that is too hard would warp to a large degree when bent under stress. Additional laminating machines are often required to flatten deformed back sheets in the production of solar cell components. This is quite time-consuming and adds to the cost. A back sheet made of laminated multi-layer PET film has insufficient flexibility and a higher degree of warpage. There is much room for improvement.

Of the above three types of back sheet structure, laminated TPE film and laminated TPT film have better mechanical strength and aging resistance, but have higher cost and higher degree of warpage, while laminated multi-layer PET film has lower cost, but lower flexibility and higher degree of warpage. The moisture barrier properties are yet to be improved for these three types of back sheets.

One objective of the present invention is to provide a laminated film that not only has excellent moisture barrier property and flexibility, but also has a lower degree of warpage in addition to a moderate price.

Another objective of the present invention is to provide a solar panel that utilizes the above-described laminated film.

SUMMARY OF THE INVENTION

The first aspect of the present invention provides a laminated film comprising two outer layers of polytrimethylene terephthalate and a middle layer laminated between the above two polytrimethylene terephthalate layers. The middle layer has one or more thin layers of film. These films of the middle layer are made of materials selected from polytrimethylene terephthalate, polyethylene-vinyl acetate, and metals.

In an embodiment of the invention, the middle layer is a polytrimethylene terephthalate film coated with a thin film of silicon dioxide.

In another embodiment of the invention, the middle layer is an aluminum foil.

In yet another embodiment of the invention, the middle layer consists of an aluminum foil and a multi-layer film of polytrimethylene terephthalate coated with a thin film of alumina (also referred to as aluminum oxide or $Al_2O_3$).

Another aspect of the present invention provides a solar panel which comprises a front sheet, a back sheet and a photovoltaic circuit between the front and back sheets. The back sheet is made of the laminated film as described in the present invention.

DETAILED DESCRIPTION

Figure 1:
FIG. 1 is a schematic view of a conventional solar panel of a prior art.

Through various studies, the inventors of the present invention have discovered that polytrimethylene terephthalate film not only has a satisfactory moisture barrier property, but also has a lower degree of warpage than PET films.

As used in the present invention, the term "degree of warpage" is defined as follows. A 50-cm wide sample of thermoplastic film is rolled up to form a cylindrical-shaped roll with a 50 cm diameter. The roll is maintained overnight in an environment of room temperature (25° C.) and 60% relative humidity. Then, a test sample (about 78.5 cm long and 50 cm wide) is cut from the roll with a diameter of 50 cm (with a semi-circumference of about 78.5 cm). The test sample is then placed on a horizontal surface with its concave facing upward. The vertical distance between its edge in the direction of the length and the horizontal surface is measured to represent the degree of warpage of the test sample.

The laminated film of this invention comprises two layers of polytrimethylene terephthalate (hereinafter referred to as outer layers of polytrimethylene terephthalate) separated by a middle layer of film. The two outer layers of polytrimethylene terephthalate may be the same or different. There are no special restrictions to the polytrimethylene terephthalate films suitable for this invention. It can be any type of polytrimethylene terephthalate films known in the art. In an embodiment of the invention, a polytrimethylene terephthalate with 30-50% crystallinity and a 45-70° C. glass transition temperature is used. In another embodiment of the invention, the polytrimethylene terephthalate has a tensile strength of 60-70 MPa, a flexural modulus of 2.4-3.0 GPa and a notched impact strength of 40-55 J/m. Polytrimethylene terephthalate suitable for the invention may have a specific gravity of 1,300-1,400 kg/m$^3$ and a 14-day moisture absorption rate equal to or less than 0.15%.

Polytrimethylene terephthalate suitable for the invention may be prepared by melt polycondensation of 1,3-propanediol and terephthalic acid, or purchased from commercial sources. In an embodiment of the invention, DuPont Sorona® polytrimethylene terephthalate is used.

The laminated outer layers of polytrimethylene terephthalate of this invention may be a blend of polytrimethylene terephthalate with other thermoplastic polyesters. The thermoplastic polyesters suitable for blending with polytrimethylene terephthalate of this invention contain a polyester resin formed by condensation of dicarboxylic acid derivatives and diol derivatives. The content of the blended polyester resins generally accounts for less than 30 wt % based on the weight of polytrimethylene terephthalate, preferably 5-20 wt %, more preferably 8-15 wt %. The suitable thermoplastic polyester resins include, for example, polyethylene terephthalate (PET), polybutylene terephthalate (PBT), polyethylene 2,6-naphthalate (PEN), poly1,4-cyclohexylene-dimethylene terephthalate (PCT) and polyethylene glycol-co-cyclohexane-1,4-dimethanol terephthalate (PETG).

Therefore, as used in the present invention, the term "polytrimethylene terephthalate" refers to a blend of polytrimethylene terephthalate with other polyesters, which accounts for 0-30 wt %, preferably 5-20 wt %, and more preferably 8-15 wt %, based on the weight of the polytrimethylene terephthalate. The outer layers of polytrimethylene terephthalate of this invention may have the same or different thickness. Each layer may independently be 10-500 micron thick, preferably 15-300 microns thick, and more preferably 20-200 microns thick. In a preferred embodiment of the invention, the outer layers of polytrimethylene terephthalate have the same thickness.

There is a middle layer between the outer layers of polytrimethylene terephthalate of this invention. The middle layer consists of one or more layers of thermoplastic polymer film and/or metal foil, depending upon specific applications.

The thermoplastic polymer film suitable for making the middle layer is selected from a polytrimethylene terephthalate film different from the outer layers of polytrimethylene terephthalate, and a polyethylene-vinyl acetate film. The middle layer can also be a tin foil or an aluminum foil.

In an embodiment of the invention, the polytrimethylene terephthalate suitable for making the middle layer has a crystallinity of 30-50% and a glass transition temperature of 45-70 ° C. In another embodiment of the invention, the polytrimethylene terephthalate has a tensile strength of 60-70 MPa, a flexural modulus of 2.4-3.0 GPa and a notched impact strength of 40-55 J/m. A polytrimethylene terephthalate suitable for this invention may have a specific gravity of 1,300-1,400 kg/m$^3$ and a 14-day moisture absorption rate equal to or less than 0.15%.

In a preferred embodiment of the invention, the middle layer may optionally contain a polyethylene terephthalate as previously described, in addition to polytrimethylene terephthalate. In another preferred embodiment of the invention, the content of the polyethylene terephthalate is 0-30 wt %, preferably 0-20 wt %, and most preferably 0-10 wt %, based on the weight of polytrimethylene terephthalate.

According to the invention, the middle layer of polytrimethylene terephthalate and/or one or both of the outer layers of polytrimethylene terephthalate may be treated to form a thin film of inorganic oxide on the above-described layers. There are no special restrictions to the inorganic oxide thin film. The inorganic oxide may be alumina, silica, stannic oxide or magnesium oxide, as long as oxygen and moisture can be blocked. Alumina and silica are preferred. The inorganic oxide thin films are usually 2 nm-1,000 nm thick, preferably 5 nm-200 nm thick, and most preferably 10 nm-100 nm thick.

The above-described inorganic oxide thin films may be formed by conventional vacuum vapor deposition, reactive sputtering, ion plating or plasma chemical vapor deposition (CVD), but most preferably, by vacuum vapor deposition.

In the present invention, at least one of the outer layers of polytrimethylene terephthalate and the middle layer of polytrimethylene terephthalate may optionally contain flame retardants, whiteners, UV absorbers, antistatic agents and moisture barrier property enhancers.

In an embodiment of the invention, the outer layers of polytrimethylene terephthalate and/or middle layer of polytrimethylene terephthalate contains titanium dioxide for whitening and increasing the resistance to UV aging. Titanium dioxide may be introduced into polytrimethylene terephthalate through in situ polymerization or melt mixing. There are no special restrictions on the particle size or amount of titanium dioxide, as long as the oxygen and water vapor barrier properties are not affected and UV aging resistance is improved. In a preferred embodiment of the invention, titanium dioxide accounts for 0.2%-40%, preferably 2%-20%, and most preferably 5%-15%, based on the weight of polytrimethylene terephthalate in the corresponding layer.

In another embodiment of the invention, the outer layers of polytrimethylene terephthalate and/or the middle layer of polytrimethylene terephthalate contain organic montmorillonite to improve heat resistance and water vapor barrier properties. Organic montmorillonite may be introduced into polytrimethylene terephthalate through in situ polymerization or melt mixing. The organic montmorillonite accounts for 0.5%-20%, preferably 1%-15%, and most preferably 2%-10%, based on the weight of polytrimethylene terephthalate in the corresponding layer.

In the present invention, the outer layers of polytrimethylene terephthalate and/or the middle layer of polytrimethylene terephthalate may be biaxially stretched to improve mechanical properties, barrier properties, optical properties, thermal properties, and thickness uniformity. The stretching ratio of the outer layers of polytrimethylene terephthalate and/or the middle layer of polytrimethylene terephthalate is usually 2-7 times, preferably 3-5 times.

The thickness of the middle layer of polytrimethylene terephthalate of this invention may be the same as or different from the thickness of the outer layers of polytrimethylene terephthalate. The middle layer of polytrimethylene terephthalate is usually 10-500 microns thick, preferably 15-300 microns thick, and most preferably 20-200 microns thick.

In the laminated film, the middle layer laminated between the two outer layers of polytrimethylene terephthalate may be polyethylene-vinyl acetate film. There are no special restrictions to the polyethylene-vinyl acetate film suitable for making such a laminated film. It may be any conventional polyethylene-vinyl acetate used for encapsulating solar panels. In an embodiment of the invention, the content of vinyl acetate in the polyethylene-vinyl acetate is 3-6 wt %, preferably 4-5 wt %.

There are no special restrictions to the thickness of a suitable polyethylene-vinyl acetate middle layer, as long as it can provide sufficient strength to the final laminated film. In an embodiment of the invention, the thickness of the polyethylene-vinyl acetate middle layer is 10-200 microns, preferably 15-150 microns, and most preferably 20-100 microns.

In the laminated film, the middle layer superimposed between the two outer layers of polytrimethylene terephthalate may also contain a metal foil such as tin foil or aluminum foil. Usually, aluminum foil is preferred. Aluminum foil should be more than 20 microns thick to avoid perforation.

Accordingly, the laminated film of this invention may have such a combination as "polytrimethylene terephthalate/polytrimethylene terephthalate/polytrimethylene terephthalate", "polytrimethylene terephthalate/polyethylene-vinyl acetate/polytrimethylene terephthalate", "polytrimethylene terephthalate/aluminum/polytrimethylene terephthalate", "polytrimethylene terephthalate/aluminum/polytrimethylene terephthalate/polytrimethylene terephthalate", "polytrimethylene terephthalate/tin/polytrimethylene terephthalate", or "polytrimethylene terephthalate/tin/polytrimethylene terephthalate/polytrimethylene terephthalate". Of these, "polytrimethylene terephthalate/aluminum/polytrimethylene terephthalate" and "polytrimethylene terephthalate/polytrimethylene terephthalate/polytrimethylene terephthalate" are preferred.

In order to meet the requirements of various applications, for example, in order to improve the light reflectivity of the back sheets to prevent photons from escaping out of the solar panels, at least one of the outer layers of polytrimethylene terephthalate may be surface treated.

There are no special restrictions to suitable surface treatment methods, as long as they meet the application requirements (such as increasing the light reflectivity of the back sheets to prevent photons from escaping out of the solar panels).

In an embodiment of the invention, surface treatment of the laminated film includes embossing a main surface of the laminated film (i.e., the main surface of one of the outer layers of polytrimethylene terephthalate) to form a number of protruding microstructures, including continuous or discrete pyramids, pyramidal frusta, cones, conical frusta, and hemispheres.

The protruding microstructures are generally 500 nm-500 μm high, preferably 2-50 μm high, and the height-to-width ratio is generally 4:1-1:10, preferably 1:1-1:4.

As used in the present invention, the term "height of the protruding microstructures" refers to the distance from the base center of a microstructure to the vertex of the microstructure (in the case of pyramids or cones), to the upper surface (in the case of pyramidal frusta or conical frusta), or the highest point (in the case of hemispheres).

As described above, the laminated film of the present invention may have a number of continuous or discrete microstructures. In a preferred embodiment of the invention, a main surface of the laminated film has a number of discrete protruding microstructures, which are uniformly distributed on the main surface at a density of $1\text{-}10^8/cm^2$, preferably $10^4\text{-}10^7/cm^2$.

In a preferred embodiment of the invention, a main surface of the laminated film has a number of discrete protruding microstructures, which form discrete islands, and are continuously distributed on each island.

In a preferred embodiment of the invention, a main surface of the laminated film has a number of discrete protruding microstructures, which form discrete islands and are discretely and uniformly distributed on each island at a density of $1\text{-}10^8/cm^2$, preferably $10^4\text{-}10^7/cm^2$.

The protruding microstructures may be formed by any conventional methods. For example, they may be embossed on the laminated film by compression using a template with desired indented texture (such as an embossing roller). In an embodiment of the invention, hollow glass microspheres are spread and coated on the surface of a polymer film to form a number of protruding microstructures.

There are no special restrictions to preparation methods of the laminated film of this invention. The laminated film may be prepared by any conventional methods, for example, by bonding all the layers together with a conductive adhesive, or by thermocompression or extrusion lamination. Common adhesives include polyethylene-polyvinyl acetate and polyurethane adhesives.

The overall thickness of the laminated films of this invention is 20-1,000 microns, preferably 50-800 microns, and most preferably 100-500 microns.

Another aspect of the present invention provides a solar panel which includes a front sheet, a back sheet and a photovoltaic circuit between the front sheet and back sheet. The back sheet is made of the above-described laminated film.

As shown in FIG. 1, a conventional solar panel comprises of a back sheet 1 made of a laminated film, encapsulation layers 2 and 4, a photovoltaic circuit 3 and a glass front sheet 5. The back sheet made of a laminated film usually consists of several layers, which may have such a combination as "polyethylene terephthalate (PET)/aluminum foil/polyethylene terephthalate"; or polyethylene terephthalate/polyethylene terephthalate/polyethylene terephthalate. Although the solar panel back sheet of the prior art exhibits good water vapor barrier property, replacing the laminated film of the prior art with the laminated film of this invention may further improve the water vapor barrier property of the solar panels. The excellent flexibility, along with a lower degree of warpage, of the laminated film of this invention will facilitate manufacture of solar panels at a moderate price.

Figure 2:
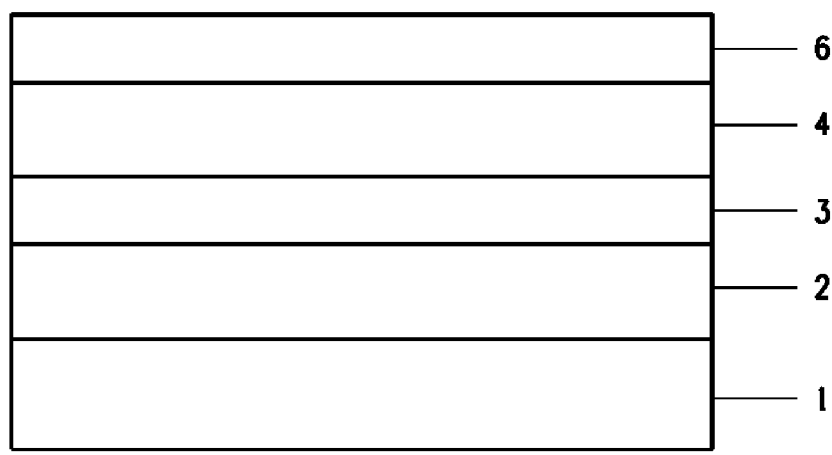
FIG. 2 is a schematic view of a solar panel as described in an embodiment of this invention.

FIG. 2 is a schematic view of a solar panel described in an embodiment of this invention. It comprises of a back sheet 1 made of the laminated film of this invention, encapsulation layers 2 and 4, a photovoltaic circuit 3, and a front sheet 6 made of glass or plastic. As used in the present invention, the term "back sheet" of a solar panel refers to the external cover sheet on a solar panel surface that does not receive sunlight.

As used in the present invention, the term "front sheet" of solar panels refers to the external cover sheet on a solar panel surface that receives sunlight. The front sheet has two surfaces. The first surface of the front sheet receives light, facing the sunlight when in use. The second surface of the front sheet is placed adjacent to the photovoltaic circuit in a solar cell.

As used in the present invention, the term "placed adjacent to the photovoltaic circuit" does not mean that the second surface of the front sheet and/or the back sheet would be in direct contact with the photovoltaic circuit in a solar cell. A layer of, for example, encapsulation material made of ethylene-vinyl acetate copolymer or a conductive adhesive may be used between the photovoltaic circuit and the second surface of the front sheet and/or the back sheet.

As used in the present invention, the term "plastic material" used for making the front sheet refers to any polymer material that has a light transmittance (for light with a wavelength ranging from 350 to 1,150 nm) higher than 88%, preferably higher than 92%, and most preferably higher than 96%. Non-restrictive examples of such a polymer material are fluoropolymers, such as tetrafluoroethylene-hexafluoropropylene copolymers, ethylene-tetrafluoroethylene copolymers, tetrafluoroethylene-hexafluoropropylene-vinylidene fluoride copolymers, polyvinylidene fluoride, polychlorotrifluoroethylene, and ethylene-chlorotrifluoroethylene copolymer; liquid crystal polymers; polyethylene terephthalate; polyethylene naphthalate; polymethacrylates such as polymethyl methacrylate and polyethyl methacrylate; polycarbonates; ethylene-vinyl alcohol copolymer; polyurethanes, as well as laminated materials made from two or more of these materials.

As used in the present invention, the term "solar panel" includes a variety of battery cells or battery modules that generate electricity when exposed to light. Depending upon requirements of specific applications, a number of such battery cells or battery modules may be combined to obtain desired electric power, voltage and current. Non-restrictive examples of the solar panels of the invention include solar panels to accommodate monocrystalline silicon solar cells, polycrystalline silicon solar cells, nano-silicon solar cells, non-crystalline thin-film silicon solar cells, thin film CdTe solar cells, thin film CIGS solar cells, and dye-sensitized solar cells.

As used in the present invention, the term "light trapping capability" refers to the capability of a solar panel to increase the number of incident photons and to reduce the number of escaping photons.

As used in the present invention, the term "surface texture for enhancing light trapping capability" refers to a number of surface microstructures formed on a plastic or glass surface by surface treatment. The surface microstructures are able to reflect and scatter the light incident on the surface, thus keeping the light inside a solar panel. The surface treatment includes embossing, microsphere coating and molding.

1. Back Sheet

The solar panel of this invention uses the above-described laminated film as a back sheet. The back sheet protects solar cells, encapsulation materials and/or conductive adhesive against moisture and oxidation. The back sheet is also used as a mechanical shield to prevent scratches and is used as an insulator during solar panel assembly. In addition, since the laminated film of the invention has a low degree of warpage, the back sheet made of such laminated film may be used directly for making solar panels without an additional flattening step, thus simplifying processing procedure and lowering manufacturing costs.

In order to improve the light trapping capability, it is desirable to use a laminated film in which the main surface has been treated. When it is put into use, the treated surface of the laminated film is placed adjacent to the photovoltaic circuit to enhance light reflection of the back sheet and to prevent light from escaping from the back sheet of solar panels.

Figure 3:
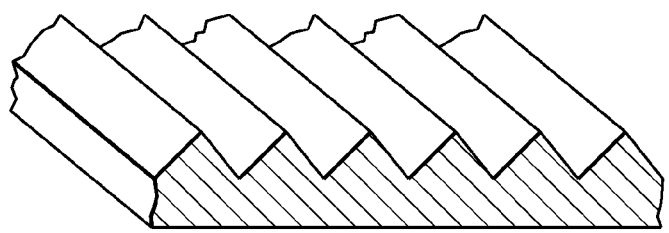
FIG. 3 is a schematic view of surface texture on the second surface of the front or back sheet in a crystalline silicon solar panel as described in an embodiment of this invention.
Figure 4:
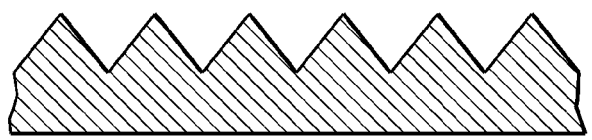
FIG. 4 is a cross-sectional view of the surface texture of FIG. 3.

FIG. 3 is a schematic view of the surface texture on the second surface of the back sheet of a crystalline silicon solar panel described in an embodiment of this invention. The cross-sectional view (FIG. 4) shows that the surface texture on the second surface of the back sheet consists of a number of regular grooves having a triangular cross-section.

Figure 5:
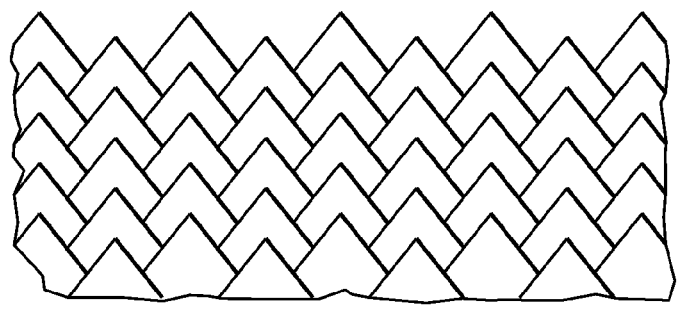
FIG. 5 is a schematic view of surface texture on the second surface of the front or back sheet of a crystalline silicon solar panel as described in another embodiment of this invention.
Figure 6:
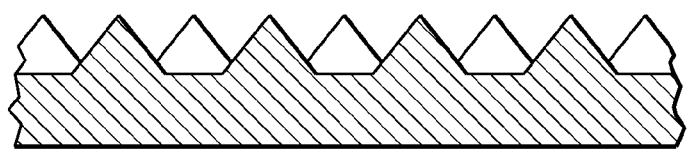
FIG. 6 is a cross-sectional view of the surface texture of FIG. 5.

FIG. 5 is a schematic view of the surface texture on the second surface of the back sheet in a crystalline silicon solar panel in another embodiment of this invention. The cross-sectional view (FIG. 6) clearly shows that the surface texture consists of many regular pyramids, which are uniformly distributed on the second surface of the entire back sheet. Preferably, the pyramids are square pyramids.

Figure 7:
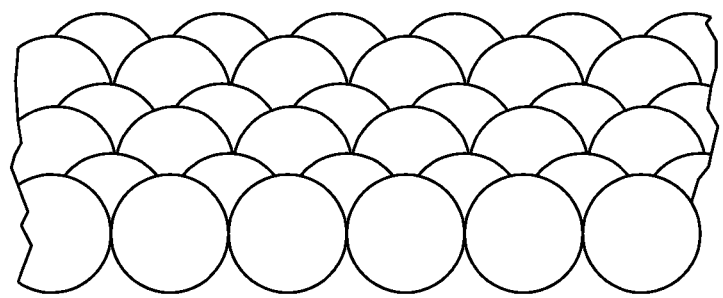
FIG. 7 is a schematic view of surface texture on the second surface of the front or back sheet in a crystalline silicon solar panel as described in another embodiment of this invention.
Figure 8:
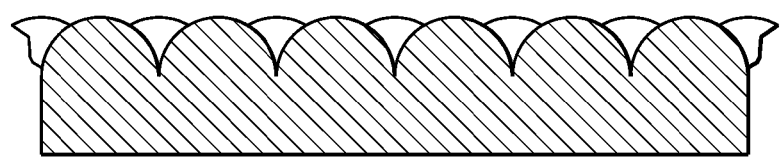
FIG. 8 is a cross-sectional view of the surface texture of FIG. 7.

FIG. 7 is a schematic view of the surface texture on the second surface of the back sheet in a crystalline silicon solar panel in another embodiment of this invention. The cross-sectional view (FIG. 8) shows that the surface texture consists of many regular hemispheres that are uniformly distributed on the second surface of the entire back sheet.

Figure 9:
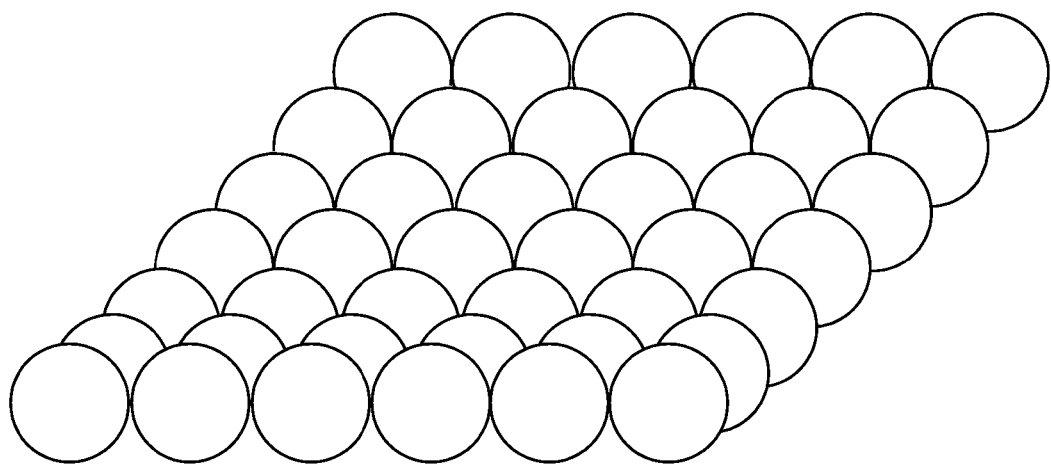
FIG. 9 is a stereoscopic schematic view of the surface texture on the second surface of the front or back sheet in a crystalline silicon solar panel as described in another embodiment of this invention.

FIG. 9 is a stereoscopic schematic view of the surface texture on the second surface of the back sheet in a crystalline silicon solar panel in another embodiment of this invention. The figure shows that the surface texture consists of many transparent hollow microspheres coated on the surface.

2. Front Sheet

In the present invention, glass or polymer materials are used for making the front sheet for solar panels. However, glass is preferred for it provides components with mechanical strength that a plastic back sheet can hardly provide. The primary role of the front sheet is to allow sunlight to penetrate through a solar panel, while protecting the solar cell photovoltaic circuit from the effects of, for example, scratches.

There are no special restrictions to the thickness of the front sheet, as long as it allows sunlight to penetrate through a solar panel while protecting the solar cell photovoltaic circuit against mechanical impact, such as the impact of hailstones. In an embodiment of the invention, the front sheet is made of a plastic material with a thickness of 20-500 microns. The glass or plastic material suitable for making the front sheet of the solar panel of this invention may be selected from high transmittance materials. The transmittance for light with a wavelength in the range of 350-1,150 nm is generally higher than 88%, preferably higher than 92%, and most preferably higher than 96%. Nonrestrictive examples of such plastic material are fluoropolymers, such as perfluoroethylene-perfluoropropylene copolymers, ethylene-tetrafluoroethylene copolymers, tetrafluoroethylene-hexafluoropropylene-vinylidene fluoride copolymers, polyvinylidene fluoride, ethylene-chlorotrifluoroethylene copolymers and polychlorotrifluoroethylene; liquid crystal polymers; polyethylene terephthalate; polyethylene naphthalate; polymethyl methacrylate; ethylene-vinyl alcohol copolymer; polycarbonates; polyurethanes, as well as laminated materials made of two or more of these materials.

In order to increase light transmittance of a solar panel, an antireflection film, also called a transmittance enhancing film, can be applied on the first surface of the front sheet for increasing sunlight incidence.

There are no special restrictions to the antireflection film. If the front sheet is made of a plastic material, a suitable antireflection film may be a high transmittance material with a refractive index lower than the front sheet material. In an embodiment of the invention, the front sheet material is made of polyvinylidene fluoride, and the antireflection film is made of perfluoroethylene-perfluoropropylene copolymer. If the front sheet is made of glass, a suitable antireflection film may be a high transmittance material with a refractive index lower than glass. In another embodiment of the invention, the front sheet material is made of glass, and the antireflection film is made of magnesium fluoride and silica. This antireflection film may be made by a sol-gel method, vapor deposition, thermal spraying or magnetic sputtering. Transmittance of the glass made with these methods can be increased from 92% to a range of 94%-96%, or even higher.

In order to increase the light trapping capability of a solar panel and thus increase overall output power, the surface of the front sheet adjacent to the photovoltaic circuit may be treated to increase light reflectivity and to reduce the amount of light emitted out of the solar panel.

There are no special restrictions to the surface treatment methods of the front sheet, as long as the surface treatment methods can increase light reflectivity of the front sheet to prevent photons from escaping out of the solar panel.

In an embodiment of the invention, the front sheet is made of glass. The main surface of the front sheet adjacent to the photovoltaic circuit is embossed to form a number of protruding or indented microstructures. The protruding microstructures include continuous or discrete grooves, pyramids, pyramidal frusta, cones, conical frusta, hemispheres, or a combination of two or more of these geometric patterns.

The protruding microstructures are generally 500 nm-500 μm high, preferably 2-50 μm high. The height-to-width ratio is generally 4:1-1:10, preferably 1:1-1:4.

As described above, the front sheet of the present invention may have a number of continuous or discrete microstructures. In a preferred embodiment of the invention, a main surface of the front sheet adjacent to the photovoltaic circuit has a number of discrete protruding microstructures, which are uniformly distributed on the main surface at a density of $1\text{-}10^8/cm^2$, preferably $10^4\text{-}10^7/cm^2$.

In a preferred embodiment of the invention, a main surface of the front sheet adjacent to the photovoltaic circuit has a number of discrete protruding microstructures, which form discrete islands, and are uniformly distributed on each island.

In a preferred embodiment of the invention, a main surface of the front sheet adjacent to the photovoltaic circuit has a number of discrete protruding microstructures, which form discrete islands, and the protruding microstructures are discretely and uniformly distributed on each island at a density of $1\text{-}10^8/cm^2$, preferably $10^4\text{-}10^7/cm^2$.

The microstructures may be formed by any conventional methods. When the front sheet is made of glass, the surface of the glass front sheet adjacent to the photovoltaic circuit (i.e., the second surface of the glass) may be treated to form a surface texture. There are no special restrictions to the surface treatment methods of the glass front sheet, as long as they can increase light reflectivity of the front sheet to prevent photons from escaping out of the solar panels.

In an embodiment of the invention, surface treatment of the glass front sheet includes softening the glass front sheet by heating, and then embossing the main surface adjacent to the photovoltaic circuit (second surface) with a template to form a number of protruding microstructures. The protruding microstructures include continuous or discrete pyramids, pyramidal frusta, cones, conical frusta, hemispheres, regular or irregular grooves, or a combination of two or more of these geometric patterns.

In another embodiment of the invention, molten glass may be poured directly into a mold to form a glass plate having surface texture on its main surface (second surface). The surface texture includes continuous or discrete pyramids, pyramidal frusta, cones, conical frusta, hemispheres, regular or irregular grooves, or a combination of two or more of these geometric patterns.

In another embodiment of the invention, the glass surface texture is formed by chemical etching. Suitable chemical etching methods are known to those having ordinary skills in the art.

The protruding microstructures are generally 500 nm-500 μm high, preferably 2-50 μm high. The height-to-width ratio is generally 4:1-1:10, preferably 1:1-1:4.

As described above, the glass front sheet of the invention may have a number of continuous or discrete microstructures. In a preferred embodiment of the invention, a main surface of the glass front sheet adjacent to the photovoltaic circuit has a number of discrete protruding microstructures, which are uniformly distributed on the main surface at a density of $1\text{-}10^8/cm^2$, preferably $10^4\text{-}10^7/cm^2$.

In a preferred embodiment of the invention, a main surface of the glass front sheet adjacent to the photovoltaic circuit has a number of discrete protruding microstructures, which form discrete islands and are continuously distributed on each island.

In a preferred embodiment of the invention, a main surface of the glass front sheet adjacent to the photovoltaic circuit has a number of discrete protruding microstructures, which form discrete islands and are discretely and uniformly distributed on each island at a density of $1\text{-}10^8/cm^2$, preferably $10^4\text{-}10^7/cm^2$.

The surface texture on the second surface of the front sheet of a crystalline silicon solar panel in an embodiment of this invention may be similar to the texture of FIG. 3. The cross-sectional view (FIG. 4) shows that the surface texture on the second surface of the front sheet consists of many regular grooves with a triangular cross-section.

The surface texture on the second surface of the front sheet of a crystalline silicon solar panel in another embodiment of this invention may be similar to the surface texture as shown in FIG. 5. The cross-sectional view (FIG. 6) clearly shows that the surface texture consists of many regular pyramids, which are uniformly distributed on the second surface of the entire front sheet.

The surface texture on the second surface of the front sheet of a crystalline silicon solar panel in another embodiment of this invention may be similar to the surface texture as shown in FIG. 7. The cross-sectional view (FIG. 8) shows that the surface texture consists of many regular hemispheres, which were uniformly distributed on the second surface of the entire front sheet.

The surface texture on the second surface of the front sheet of a crystalline silicon solar panel in another embodiment of this invention may be similar to the stereoscopic schematic view of the surface texture shown in FIG. 9. The figure shows that the surface texture consists of many transparent hollow microspheres coated on the surface.

In the solar panel of the present invention, the surface texture on the second surface of the front sheet and the back sheet may be the same or different. Those having ordinary skills in the art can easily determine a suitable surface texture according to their expertise and specific requirements of the battery cells, such as process requirement for embossed textures and battery plate thickness.

3. Solar Photovoltaic Circuit

There are no special restrictions to the types of solar cell photovoltaic circuit suitable for this invention. They can be made of, but are not limited to, monocrystalline silicon, polycrystalline silicon, nano-silicon, non-crystalline silicon, cadmium telluride or copper indium gallium selenium.

4. Polymer Encapsulation Layer

The solar panel of this invention uses conventional polymeric encapsulation materials for encapsulating the solar photovoltaic circuit and bonding the above-described front and back sheet to the solar photovoltaic circuit. Examples of suitable polymeric encapsulation materials include, for example, ethylene-vinyl acetate copolymers. The thickness of the polymeric encapsulation layer is generally 200-800 microns, preferably 250-750 microns, and more preferably 300-650 microns.

In an embodiment of the invention, a conductive adhesive is used to replace the polymeric encapsulation materials. The conductive adhesives may be any type of conductive adhesive commonly used in the art.

The solar panels of this invention may be made by any conventional methods known in the art. In an embodiment of the invention, the method disclosed in the Chinese Patent CN02143582.0 is used for manufacturing solar panels, but the front sheet and back sheet as described in that patent art are replaced respectively with the surface-treated front sheet and optionally surface-treated plastic back sheet of this invention.

The present invention is further exemplified by the following illustrative examples.

EXAMPLES

Test Method

1. Moisture Barrier Property of Laminated Film

The moisture barrier property of the laminated film was determined by using a Permatran-W model 700 instrument (purchased from Mocon, Inc. of the United States) according to ASTM F1249-06 (Standard Test Method for Water Vapor Transmission Rate through Plastic Film and Sheeting Using a Modulated Infrared Sensor) of the American Society of Testing and Materials. The water vapor transmission rate was tested at 100% relative humidity. The testing process followed a principle of isobaric method. An environment of 100% relative humidity was established on one side of a film sample. The other side of the film was purged with flowing nitrogen gas, and the gas was carried by a carrier gas to a customized pressure-modulated infrared sensor. The sensor receives water vapor and converts moisture content into an electrical output signal. This method is suitable for testing film materials having a high moisture barrier that are not sensitive to moisture.

2. Hydrothermal Aging Test of Laminated Film

The hydrothermal aging test of laminated film was carried out in a climate chamber VC4018 (purchased from Vötsch Industrietechnik GmbH, Germany) according to Clause 10.13 of IEC 61215 Standard. A sample was maintained for 1,000 hrs at a temperature of 85° C. and relative humidity of 85%. The sample was taken out afterwards and laminated with a 500-micron-thick EVA film by thermocompression. Then it was placed in the climate chamber again. Another 1000 hrs later, the sample was taken out and tested for peeling strength according to ASTM D1876 standard. Samples having a peeling strength greater than 40 N/cm were considered to be up to standard.

3. Flexibility of Laminated Film

Generally, the flexibility of laminated film was characterized by flexural modulus. Flexural modulus was measured with a three-point bend on a Q800 dynamic mechanical analyzer of TA Instruments of the United States. The test sample was 10 mm in length and 5 mm in width. The distance between two holding points of the sample clamp was 5 mm.

4. Degree of Warpage of Laminated Film

A thermoplastic film sample having a width of 50 cm was rolled up to form a film roll. The roll was maintained overnight in an environment at room temperature (25° C.) and 60% relative humidity. Then a test sample of about 78.5 cm in length (50 cm in width) was cut from the roll with a diameter of 50 cm. The test sample is then placed on a horizontal surface with its concave facing upward. After being stabilized for 5 min, the vertical distance between its edge in the direction of the length and the horizontal surface is measured. An average value of 10 measurements was calculated to represent the degree of warpage of the test sample. Normally, samples with a degree of warpage being less than 5 cm were considered as up to standard.

5. Light Trapping Capability

Various back sheets were prepared according to the method of the present invention, tested for their light trapping capability, and then compared with ordinary front and back sheets. The light transmittance and reflectivity of front sheets and back sheets were individually measured on a Lambda 950 UV/visible/Near-IR spectrophotometer (including a 150 mm integrating sphere) from Perkin Elmer, U.S.A. The data obtained were averaged over wavelengths ranging from 400 nm to 1,100 nm. When measuring the reflectivity of one surface, in order to avoid interference coming from another surface, the other surface was painted black with commercially available black ink or an oily black marker, depending on whether the surface was hydrophilic or not.

6. Hydrothermal Aging Test on Solar Cell Components

The process for encapsulating solar cell components includes sorting the solar cells, single welding, serial welding, stacking, laminating, component testing, framing and cleaning. The hydrothermal aging test of laminated solar cell components was carried out in a climate chamber VC4018 (purchased from Vötsch Industrietechnik GmbH, Germany) according to Clause 10.13 of IEC 61215 Standard. Solar cell components for testing were maintained for 1,000 hrs at a temperature of 85° C. and relative humidity of 85%.

Then, the components were taken out, and the encapsulation layer of ethylene-vinyl acetate copolymer was peeled off. Then, the peeled encapsulation layer of ethylene-vinyl acetate copolymer was tested for its yellowing index ΔYI on a Lambda 950 UV/visible/Near-IR spectrophotometer (including a 150 mm integrating sphere) from Perkin Elmer, U.S.A. Most preferably, the index is zero.

7. Testing Method of Solar Cell Output Power

Solar cell output power was determined by using a 3500 SLP component testing system (purchased from Spire Corporation, U.S.A.), and was compared with polycrystalline silicon solar cells assembled from ordinary front and back sheets.

8. Processing Methods a) Preparation of laminated polymer film of the present invention Polymer film was prepared from polytrimethylene terephthalate resin (DuPont Sorona® bright-grade transparent polymer) or polyethylene terephthalate by using an extrusion casting apparatus. The film was then biaxially stretched to a final film thickness of 200 microns, 150 microns and 15 microns, and used respectively for making the first outer layer (the outermost layer), the middle layer and the second outer layer, which is the innermost layer (relative to the position of battery cells).

Laminating multiple film layers was accomplished on a coating and laminating machine. A polyurethane-based industrial adhesive was coated, and then the multiple film layers were bonded together and dried at 60° C. to form a laminated polytrimethylene terephthalate film of the present invention and a conventional laminated polyethylene terephthalate film.

b) Modification of the laminated polymer film of the present invention

The above procedure for preparation of the laminated polymer film of the present invention was repeated, but in order to enhance film brightness, aging resistance and moisture barrier properties and heat resistance, 7% of titanium dioxide and 6% of polymer-grade nano-montmorillonite, relative to the weight of the polymer film, were added to the outermost and innermost layers by blending in a molten state. A 40-nm-thick layer of silicon dioxide was coated on the 15-micron-thick innermost film by vacuum coating to further improve the moisture barrier property of the film. A 40-nm-thick layer of aluminum oxide was coated on both surfaces of the middle layer by vacuum coating.

Laminating multiple film layers was accomplished on a coating and laminating machine. A polyurethane-based industrial adhesive was coated, and then the multiple film layers were bonded together and dried at 60° C. to form a modified laminated polytrimethylene terephthalate film of the present invention and a modified conventional laminated polyethylene terephthalate film.

In the following examples the back sheet includes: "regular" PTT and "modified" PTT. The "regular" PTT is made from pure PTT without additives, while the modified PTT has $TiO_2$, $SiO_2$, clay or $Al_2O_3$ to improve the moisture barrier and aging resistance. The $TiO_2$ and clay were mixed into the polymer by compounding. $SiO_2$ and $Al_2O_3$ were coated using vacuum sputtering. In this structure, the middle layer can also be a multi-layered structure, such as: PTT+EVA, PTT+Al foil, EVA+Al foil, Al foil, PET and so on.

Example 1

This example illustrates a laminated film made from three layers of regular polytrimethylene terephthalate. The film has superior moisture barrier property, flexibility and degree of warpage over the laminated film made from multi-layers of polyethylene terephthalate film. Compared with a back sheet made from TPT, the laminated polytrimethylene terephthalate film of the invention exhibits an equivalent moisture barrier property and superior flexibility and degree of warpage.

Using the above-described method, the water vapor transmission rate, flexural modulus and degree of warpage of the laminated film of this invention were determined to be 1.3 $g/m^2/day$, 1,553 MPa and 2.7 cm, respectively.

The laminated film was bonded by thermocompression with a 500-micron-thick encapsulation layer made of ethylene-vinyl acetate copolymer, and was then subject to a hydrothermal aging test using the above-described method to determine adhesion strength of the laminated film to the encapsulation layer of ethylene-vinyl acetate copolymer. The test result was 57 N/cm. A special type of glass was provided (3.2 mm thick high transmittance tempered glass, purchased from Dongguan CSG Solar Glass Co., Ltd.). A uniform square pyramid-shaped surface texture was embossed on the glass by thermocompression. The square pyramid-shaped texture was uniformly distributed over the entire glass surface at a density of $1.0 \times 10^6/cm^2$. Each square pyramid has a height of 5.0 microns and a base edge length of 10 microns. The distance between vertices of two adjacent square pyramids was 10 microns.

Using the above-described glass (1,574 mm×801 mm) as a front sheet, the above-described laminated film (1,584 mm×810 mm) as a back sheet, and the above-described EVA copolymer (1,584 mm×810 mm) as an encapsulation layer, and 72 pieces of 125×125 mm monocrystalline silicon cells (single cell power output was 2.4 watts; purchased from JA Solar Holdings Co., Ltd., Hebei Province) were laminated by vacuum lamination to form a solar panel, with the textured surface of the front sheet being placed adjacent to the solar cells.

Using the above-described method, the output power of the assembled battery cell was determined to be 179 watts.

Using the above-described method to carry out a hydrothermal aging test of the assembled battery cell, the yellowing index of the aged encapsulation layer of ethylene-vinyl acetate copolymer was determined to be 2.2.

Example 2

This example is substantially the same as Example 1 except that all three layers of the PTT/PTT/PTT laminate are modified PTT. The modified PTT used for the outer layers contained $TiO_2$ (7 wt %) and clay (6 wt %). The innermost layer was also vacuum-coated with a 40 nm-thick layer of $SiO_2$. The middle layer was vacuum-coated with 40 nm-thick layer of aluminum oxide on both sides.

The modified laminated polymer film was prepared with the above-described method. Using the above-described method, the water vapor transmission rate, flexural modulus and degree of warpage of the modified laminated film were determined to be 0.9 $g/m^2/day$, 1,896 MPa and 3.0 cm, respectively.

The modified laminated polymer film was bonded by thermocompression with a 500-micron-thick encapsulation layer made of ethylene-vinyl acetate copolymer, and was then subject to a hydrothermal aging test using the above-described method to determine the adhesion strength of the laminated film to the encapsulation layer of ethylene-vinyl acetate copolymer. The test result was 52 N/cm.

Using the same method as described above to prepare a solar cell, the output power of the solar cell was determined to be 179 watts.

Using the above-described method to carry out a hydrothermal aging test of the assembled battery cell, the yellowing index of the aged encapsulation layer of ethylene-vinyl acetate copolymer was determined to be 1.8.

Example 3

This example illustrates that another type of laminated film wherein the film has outer layers the same as Example 2 but the middle layer is Al foil with a thickness of 25 microns. The film has superior moisture barrier property, flexibility and degree of warpage over the laminated film made from multi-layers of polyethylene terephthalate. Compared with a back sheet made from TPT, the laminated polytrimethylene terephthalate film of the invention exhibits an equivalent moisture barrier property and superior flexibility and degree of warpage.

Using the above-described method, the moisture barrier property, flexural modulus and degree of warpage of the laminated film were determined to be 0.01 g/m$^2$/day, 1,537 MPa and 2.7 cm, respectively.

The laminated film was bonded by thermocompression with a 500-micron-thick EVA film, and was then subject to a hydrothermal aging test using the above-described method to determine adhesion strength of the laminated film to the EVA layer. The test result was 52 N/cm.

Using the same method as described above to prepare a solar cell, the output power of the solar cell was determined to be 179 watts.

Using the above-described method to carry out a hydrothermal aging test of the assembled battery cell, the yellowing index $\Delta YI$ of the aged encapsulation layer of ethylene-vinyl acetate copolymer was determined to be zero.

Example 4

This example illustrates a laminated film having the same outer layers as Example 2 with a middle layer being EVA. The laminated film exhibits superior moisture barrier property, flexibility and degree of warpage over the laminated film made from multi-layers of regular polyethylene terephthalate film. Compared with a back sheet made from TPT, the laminated polytrimethylene terephthalate laminated film exhibits an equivalent moisture barrier property and superior flexibility and degree of warpage.

The middle layer of the laminated film was a 200-micron-thick EVA film. Using the above-described method, the moisture barrier property, flexural modulus and degree of warpage of the laminated film were determined to be 1.2 g/m$^2$/day, 1,624 MPa and 2.3 cm respectively.

The laminated film was bonded by thermocompression with a 500-micron-thick EVA film, and was then subject to a hydrothermal aging test using the above-described method to determine adhesion strength of the laminated film to the EVA layer. The test result was 52 N/cm.

Using the same method as described above to prepare a solar cell, the output power of the solar cell was determined to be 179 watts.

Using the above-described method to carry out a hydrothermal aging test of the assembled battery cell, the yellowing index $\Delta YI$ of the aged encapsulation layer of ethylene-vinyl acetate copolymer was determined to be 2.9.

Example 5

This example illustrates that solar cells made from the laminated film of the present invention have high output power.

This example has the same laminated layers as Example 2 except that before being bonded with an EVA film by thermocompression, the laminated film was rolled under an embossing roller (from BGE of the United States) at the temperature of 140° C. to form a square pyramid-shaped surface texture on the surface of the laminated film. The surface texture was uniformly distributed over the entire polymer surface at a density of $1.0 \times 10^6$/cm$^2$. Each square pyramid has a height of 5.0 microns and a base edge length of 10 microns. The distance between vertices of two adjacent square pyramids was 10 microns. The laminated film was then bonded with an EVA film by thermocompression, and was then subjected to a hydrothermal aging test using the above-described method to determine the adhesion strength of the laminated film to the EVA layer. The test result was 54 N/cm.

Using the same method as described above to prepare a solar cell, the output power of the solar cell was determined to be 183 watts.

Using the above-described method to carry out a hydrothermal aging test of the assembled battery cell, the yellowing index $\Delta YI$ of the aged encapsulation layer of ethylene-vinyl acetate copolymer was determined to be 1.8.

Example 6

This example illustrates that solar cells made from another type of laminated film of the present invention have high output power.

This example uses the same laminated film as Example 3 except that before being bonded with an EVA film by thermocompression, the laminated film was rolled under an embossing roller (from BGE of the United States) at the temperature of 140° C. to form a surface texture of hemispheres on the surface of the laminated film. The surface texture was uniformly distributed over the entire polymer surface at a density of $1.0 \times 10^6$/cm$^2$. Each hemisphere has a height of 5.0 microns and a bottom diameter of 10 microns. The distance between vertices of two adjacent hemispheres was 10 microns. The laminated film was then bonded with an EVA film by thermocompression, and was then subjected to a hydrothermal aging test using the above-described method to determine the adhesion strength of the laminated film to the EVA layer. The test result was 54 N/cm.

Using the same method as described above to prepare a solar cell, the output power of the solar cell was determined to be 183 watts.

Using the above-described method to carry out a hydrothermal aging test of the assembled battery cell, the yellowing index $\Delta YI$ of the aged encapsulation layer of ethylene-vinyl acetate copolymer was determined to be zero.

Comparative Example 7

This example uses a back sheet was made of a laminated film consisting of three layers of modified polyethylene terephthalate (PET) with a thickness of 15 microns, 150 microns and 200 microns, respectively (i.e., the modified conventional laminated polymer film as described above). The modified PET used for the outer layers contained TiO$_2$ (7 wt %) and clay (6 wt %). The innermost layer was also vacuum-coated with a 40 nm-thick layer of SiO$_2$. The middle layer was vacuum-coated with 40 nm-thick layer of aluminum oxide on both sides. The water vapor transmission rate, flexural modulus and degree of warpage of the laminated film of this invention were determined to be 1.3 g/m²/day, 2,370 MPa and 7 cm, respectively.

The laminated film was bonded by thermocompression with a 500-micron-thick EVA film, and was then subject to a hydrothermal aging test using the above-described method to determine adhesion strength of the laminated film to the EVA layer. The test result was 60 N/cm.

Using the same method as described above to prepare a solar cell, the output power of the solar cell was determined to be 179 watts.

Using the above-described method to carry out a hydrothermal aging test of the assembled battery cell, the yellowing index ΔYI of the aged encapsulation layer of ethylene-vinyl acetate copolymer was determined to be 5.

Comparative Example 8

This example uses a TPT back sheet was purchased from Isovolta Group of Austria (Tedlar®/PET/Tedlar® with a thickness of 37.5/250/37.5 microns, respectively, wherein Tedlar® is PV2001 from E. I. du Pont de Nemours and Company, USA). The water vapor transmission rate, flexural modulus and degree of warpage of the back sheet were 1.0 g/m²/day, 3,440 MPa and 8.8 cm, respectively.

The laminated film was bonded by thermocompression with a 500-micron-thick EVA film, and was then subject to a hydrothermal aging test using the above-described method to determine the adhesion strength of the laminated film to the EVA layer. The test result was 60 N/cm.

Using the same method as described above to prepare a solar cell, the output power of the solar cell was determined to be 179 watts.

Using the above-described method to carry out a hydrothermal aging test of the assembled battery cell, the yellowing index ΔYI of the aged encapsulation layer of ethylene-vinyl acetate copolymer was determined to be 1.8.

What is claimed is:

1. A solar panel which comprises a front sheet, a back sheet and a photovoltaic circuit between the front sheet and back sheet, and the back sheet is made of a laminated film comprising two biaxially stretched outer layers of polytrimethylene terephthalate and a biaxially stretched middle layer of polytrimethylene terephthalate different from the polytrimethylene terephthalate of the two outer layers.

2. The solar panel of claim 1, characterized in that the back sheet laminated film outer layers of polytrimethylene terephthalate and the middle layer of polytrimethylene terephthalate have a crystallinity of 30-50% and a glass transition temperature of 45-70° C.

3. The solar panel of claim 2, characterized in that the back sheet laminated film outer layers of polytrimethylene terephthalate and the middle layer of polytrimethylene terephthalate have a tensile strength of 60-70 MPa, a flexural modulus of 2.4-3.0 GPa, and a notched impact strength of 40-55 J/m.

4. The solar panel of claim 2, characterized in that the back sheet laminated film outer layers of polytrimethylene terephthalate and the middle layer of polytrimethylene terephthalate have a specific gravity of 1,300-1,400 kg/m³, and a 14-day moisture absorption rate equal to or less than 0.15%.

5. The solar panel of claim 1, characterized in that the back sheet laminated film outer layers of polytrimethylene terephthalate are made of a blend of polytrimethylene terephthalate with other thermoplastic polyesters, and the content of the other thermoplastic polyesters of the two outer layers is less than 30 wt % of the polytrimethylene terephthalate of the two outer layers.

6. The solar panel of claim 5, characterized in that the content of the other thermoplastic polyesters of the two outer layers is 5-20 wt % of the polytrimethylene terephthalate of the two outer layers.

7. The solar panel of claim 6, characterized in that the content of the other thermoplastic polyesters of the two outer layers is 8-15 wt % of the polytrimethylene terephthalate of the two outer layers.

8. The solar panel of claim 5, wherein the other thermoplastic polyesters of the two outer layers are selected from the group consisting of polyethylene terephthalate, polybutylene terephthalate, polyethylene 2,6-naphthalate, poly(1,4-cyclohexylene-dimethylene terephthalate), and polyethylene glycol-co-cyclohexane-1,4-dimethanol terephthalate.

9. The solar panel of claim 1, characterized in that the back sheet laminated film two outer layers of polytrimethylene terephthalate have the same or different thickness of 10-500 microns.

10. The solar panel of claim 9, characterized in that the back sheet laminated film two outer layers of polytrimethylene terephthalate have the same or different thickness of 15-300 microns.

11. The solar panel of claim 10, characterized in that the back sheet laminated film two outer layers of polytrimethylene terephthalate have the same or different thickness of 20-200 microns.

12. The solar panel of claim 1, characterized in that the back sheet laminated film middle layer of polytrimethylene terephthalate contains polyethylene terephthalate at 0-30 wt % of the polytrimethylene terephthalate in the middle layer.

13. The solar panel of claim 1, characterized in that there is a film of an inorganic oxide on the surface of at least one of the middle layer of polytrimethylene terephthalate and the two outer layers of polytrimethylene terephthalate of the back sheet laminated film.

14. The solar panel of claim 13, characterized in that the inorganic oxide is selected from the group consisting of alumina, silica, stannic oxide and magnesium oxide, and the thickness of the inorganic oxide thin film is 2 nm-1,000 nm.

15. The solar panel of claim 1, characterized in that at least one of the back sheet laminated film two outer layers of polytrimethylene terephthalate and the middle layer of polytrimethylene terephthalate contains flame retardants, whiteners, UV absorbers or antistatic agents.

16. The solar panel of claim 1, characterized in that at least one of the back sheet laminated film two outer layers of polytrimethylene terephthalate and the middle layer of polytrimethylene terephthalate contains titanium dioxide, and wherein the titanium dioxide comprises 0.2%-40% of the total weight of the polytrimethylene terephthalate of the layer.

17. The solar panel of claim 1, characterized in that the back sheet laminated film middle layer of polytrimethylene terephthalate has a thickness of 10-500 microns.

* * * * *